United States Patent [19]
Haddad et al.

[11] Patent Number: 5,815,438
[45] Date of Patent: Sep. 29, 1998

[54] OPTIMIZED BIASING SCHEME FOR NAND READ AND HOT-CARRIER WRITE OPERATIONS

[75] Inventors: Sameer S. Haddad, San Jose; Pau-Ling Chen, Saratoga, both of Calif.

[73] Assignee: Advanced Micro Devices, Inc., Sunnyvale, Calif.

[21] Appl. No.: 810,170

[22] Filed: Feb. 28, 1997

[51] Int. Cl.[6] .................................................. G11C 16/06
[52] U.S. Cl. ................................ 365/185.17; 365/185.19
[58] Field of Search ........................ 365/185.17, 185.19, 365/185.24, 185.01

[56] References Cited

U.S. PATENT DOCUMENTS 5,589,699  12/1996  Araki ................................. 365/185.17
5,591,999  1/1997   Momodomi et al. ............... 365/185.17
5,694,356  12/1997  Wong et al. ........................ 365/185.19

*Primary Examiner*—Vu A. Le
*Attorney, Agent, or Firm*—Davis Chin

[57] ABSTRACT

There is provided an improved method for eliminating hot-carrier disturb during a read operation in a NAND memory architecture in which a floating gate device is used as a select gate. A first positive pulse voltage having a ramp-rate characteristic on its leading edge is applied to the drain of the floating gate device during the read operation. Simultaneously, a second positive pulse voltage is applied to the control gate of the floating gate device during the read operation so as to overlap the first positive pulse voltage.

20 Claims, 3 Drawing Sheets

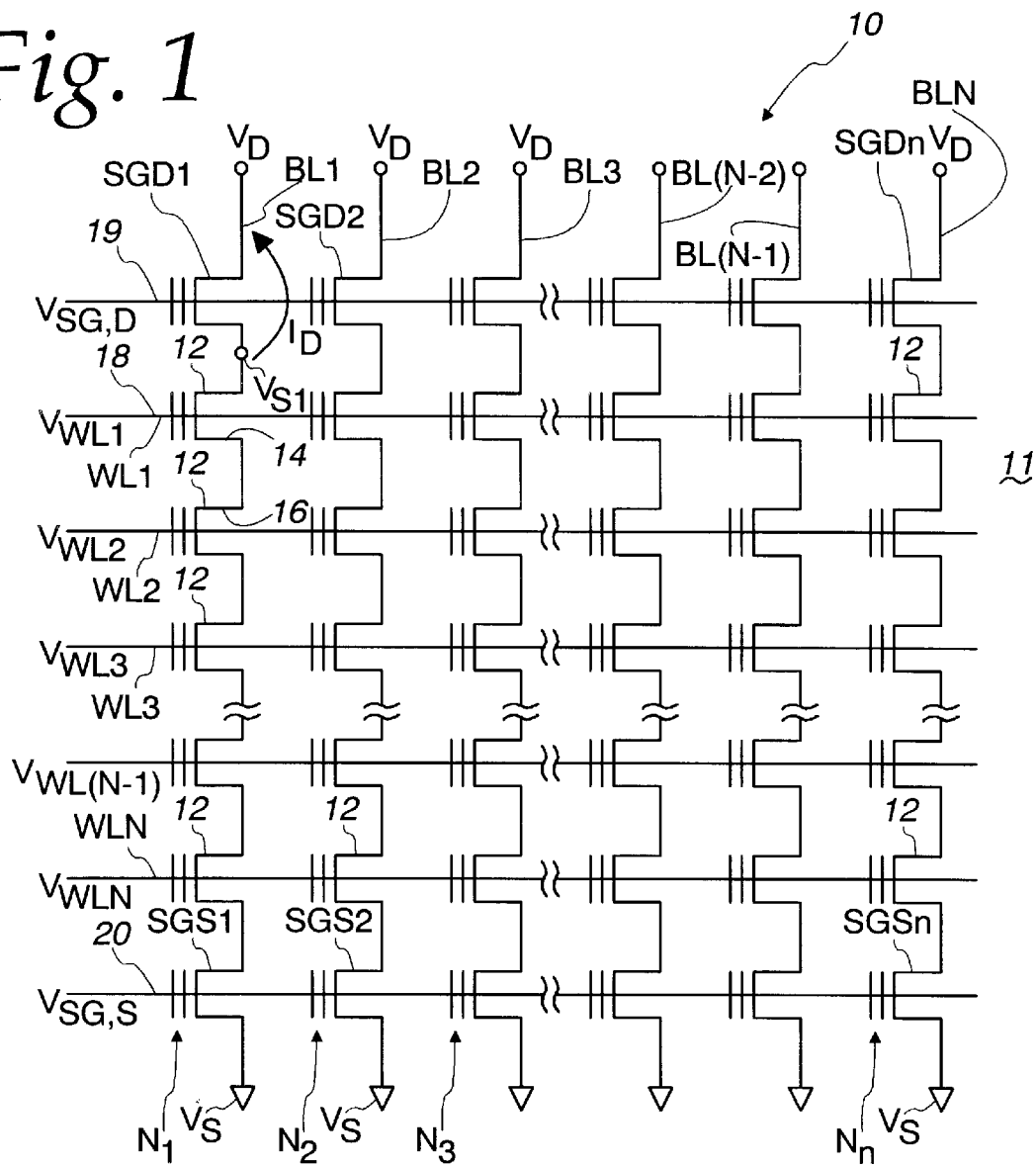
Fig. 1
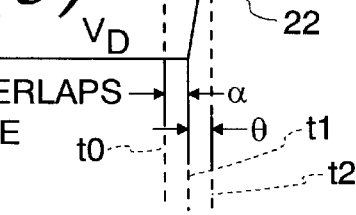
Fig. 2(a) — $V_{SG}, V_{WL}$'S — 3.3 → 5V SELECT GATES AND WORD LINES DURING READ.
Fig. 2(b) — $V_D$ — 2.5 → 3.5V BIT LINE DURING READ.
GATE PULSE OVERLAPS THE DRAIN PULSE

OPTIMIZED BIASING SCHEME FOR NAND READ AND HOT-CARRIER WRITE OPERATIONS

BACKGROUND OF THE INVENTION

1. Field of the Invention

This invention relates generally to floating gate devices used as select gate devices for NAND Flash memory architecture. More particularly, the present invention is directed to a new and improved biasing scheme for eliminating hot-carrier disturb of a floating gate device used as a select gate during a read operation for NAND memory architecture.

2. Description of the Prior Art

As is generally known in the art, there exists a class of non-volatile memory devices referred to as "Flash EEPROMs" which has recently emerged as an important memory device by combining the advantages of EPROM density with EEPROM electrical erasability. Such Flash EEPROMs provide electrical erasing and a small cell size. One type of architecture used for Flash memories is typically referred to as a NAND Flash memory architecture which is an array of Flash EEPROM cells (floating gate devices) arranged in rows of word lines and columns of bit lines intersecting the rows of word lines so as to form a matrix.

Typically, in a 32 Mb memory architecture the approximately 32 million memory cells are arranged in a regular matrix pattern of $2^{13}$ rows and $2^{12}$ columns. Preferably, groups of columns are organized such that each group defines a page. Each page represents a number of bytes. For instance, the $2^{12}$ columns may be divided into four pages so that each page will contain 128 bytes or 1,024 bits. Further, a predetermined number of rows may be grouped together so as to form a sector defining a selectable block. For example, the $2^{13}$ rows may be divided into 512 sectors with each sector containing 16 rows. In this case, each sector will consist of 64K memory cells.

In each sector, each of the floating gate devices in each column of bit lines is connected in series to the next floating gate device by joining the source of one device to the drain of the next device. Each of the control gates of the floating gate devices in the same row is connected to a corresponding one of the word lines. Before the first word line, a select gate drain formed of a floating gate device is connected to a corresponding one of the columns of bit lines. Similarly, after the last word line a select gate source formed of a dual floating gate device is connected to the corresponding one of the columns of bit lines. Such a NAND Flash memory architecture is illustrated and described in co-pending application Ser. No. 08/668,632 filed on Jun. 18, 1996, and entitled "Using Floating Gate Devices as Select Gate Devices for NAND Flash Memory and its Bias Scheme." This Ser. No. 08/668,632 is assigned to the same assignee as the present invention and is hereby incorporated in its entirety by reference.

According to conventional Read operation, the floating gate device utilized as the select gate drain is required to pass the high drain voltage $V_D$ (+3.5 V applied to its drain for a +3.0 V part) for the entire useful life of the floating gate device (e.g., 10 years). At the same time, the control gate has applied thereto a voltage in the range of +4.5 V–+5.0 V in order to pass the drain voltage. Thus, the source will be pulled up to a voltage $V_S$ which is proportional to one threshold voltage $V_T$ below the control gate voltage.

A problem arises when the read pulse applied to the drain rises too quickly so as to cause a large drain-source $V_{DS}$ to be applied across the select gate device since the source voltage will be pulling up from a low voltage (e.g., 0 volts) and thus resulting in a high field causing an accumulative soft undesired programming (hot-carrier disturb) of the select gate device. This problem of hot-carrier disturb will increase the threshold voltage $V_T$ of the select gate device and will suppress the passing of the required high drain voltage for the Read operation with the appropriately applied control gate voltage. Consequently, hot-carrier disturb of the select gate drain during the Read operation is a major concern for the NAND memory architecture using a floating gate device as the select gate drain.

The inventors have now discovered a new and improved method for eliminating hot-carrier disturb of a floating gate device used as a select gate during a Read operation for NAND memory architecture. This is accomplished in the present invention by applying a word line voltage on the control gates of the select gate device which overlaps the Read pulse applied to the drain of the select gate device during Read and simultaneously ramping up gradually the leading edge of the Read pulse so as to maintain the select gate device in the linear region.

SUMMARY OF THE INVENTION

Accordingly, it is a general object of the present invention to provide a new and improved method for eliminating hot-carrier disturb of a floating gate device used as a select gate during a Read operation for NAND memory architecture which has been traditionally unavailable.

It is an object of the present invention to provide an improved biasing scheme for eliminating hot-carrier disturb of a floating gate device used as a select gate during a Read operation for NAND memory architecture, thereby rendering an optimized performance.

It is another object of the present invention to provide a new and improved method for eliminating hot-carrier disturb of a floating gate device used as a select gate during a Read operation for NAND memory architecture which reduces significantly the complexity of the NAND memory architecture and thus its manufacturing costs.

It is still another object of the present invention to provide an improved method for eliminating hot-carrier disturb of a floating gate device used as a select gate during a Read operation for NAND memory architecture which is realized by applying a word line voltage on the control gate of the select gate device which overlaps the Read pulse applied to the drain of the select gate device during Read and simultaneously ramping up gradually the leading edge of the Read pulse so as to maintain the select gate device in the linear region.

In a preferred embodiment of the present invention, there is provided a method for eliminating hot-carrier disturb during a Read operation in a NAND memory architecture in which a floating gate device is used as a select gate. This is accomplished by applying a first positive pulse voltage having a ramp-rate characteristic on its leading edge to the drain of the floating gate device during the Read operation. Simultaneously, there is applied a second positive pulse voltage to the control gate of the floating gate device during the Read operation so as to overlap the first positive pulse voltage.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a schematic diagram of a conventional NAND Flash memory architecture of the prior art in which the biasing scheme of the present invention can be employed;

FIGS. 2(a) and 2(b) are waveforms of the voltage applied to the control gates of the select gate devices and the unselected memory cell transistors and to the drain of the select gate during the Read operation, according to the present invention;

DESCRIPTION OF THE PREFERRED EMBODIMENT

Figure 3:
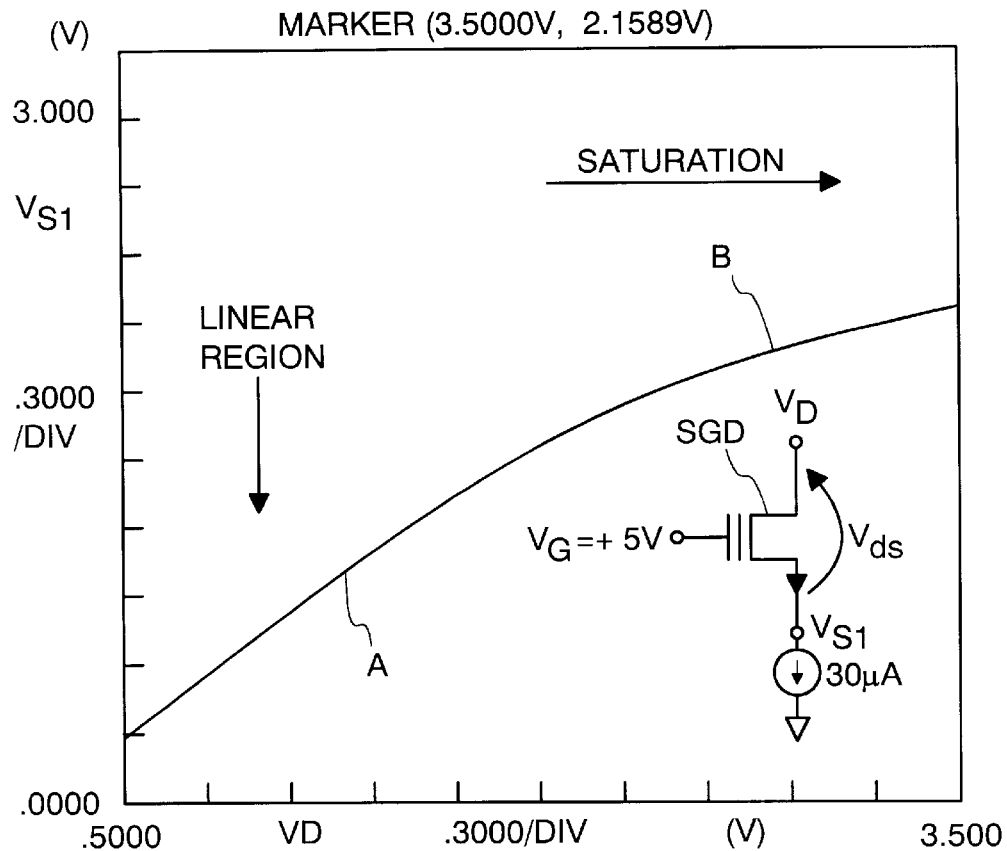
FIG. 3 shows the measured source pull-up voltage as a function of sweeping the drain voltage positively with the control gate being set to +5.0 volts.

Referring now in detail to the drawings, there is illustrated in FIG. 1 a schematic diagram of a conventional NAND Flash memory architecture 10 of the prior art in which the method of eliminating hot-carrier disturb of a floating gate device used as a select gate can be employed according to the present invention. The NAND Flash memory architecture 10 includes an array sector 11 of Flash electrically erasable and programmable read-only memory (EEPROM) cells 12 (floating gate transistor devices) arranged in rows of word lines WL1, WL2, . . . WLn and columns of bit lines BL1, BL2, . . . BLn intersecting the rows of word lines so as to form the sector.

It is to be clearly understood that the array sector 11 represents only one of a large number of identical sectors provided on a single integrated circuit memory chip. In a 32 Mb memory architecture, there may be 512 sectors each sector being formed of 16 rows of word lines and 4,096 columns of bit lines. Each row corresponds to a page or a number of pages. For the sake of simplicity, only a portion of the NAND strings N1, N2, . . . Nn in the bit lines BL1, BL2, BL3, . . . BLn in the array sector 11 has been shown. Each of the NAND strings consists of a plurality of the memory cells 12 (such as 16 cells) coupled between two select gate devices.

As can be seen, in the array sector each of the floating gate transistor devices 12 in each column of the bit lines BL1 . . . BLn is connected in series to the next floating gate transistor device 12 by joining the source 14 of one transistor device to the drain 16 of the next transistor device 12. Each of the control gates 18 of the transistor devices 12 in the same row is connected to a corresponding one of the word lines WL1 . . . WLn. Before the first word line WL1, the select gate drain formed of floating gate transistors SGD1 . . . SGDn is coupled between one end of corresponding ones of the NAND strings and corresponding ones of the columns of bit lines BL1. . .BLn. For example, the drain of the transistor SGD1 is connected to a first power supply or potential $V_D$ and the source of the transistor SGD1 is connected to the drain of the array floating gate transistor 12 associated with the first word line WL1 in the NAND string N1. Similarly, the drain of the transistor SGD2 is connected to the supply potential $V_D$ and the source of the transistor SGD2 is connected to the drain of the array floating gate transistor 12 associated with the first word line in the NAND string N2. Finally, the drain of the transistor SGDn is connected to the supply potential $V_D$ and the source of the transistor SGDn is connected to the drain of the array floating gate transistor 12 associated with the first word line WL1 in the NAND string Nn. The gates of all of the select gate transistors SGD1 . . . SGDn are connected together and to a common line 19.

After the last word line WLn, a select gate source formed of floating gate transistor devices SGS1 . . . SGSn is coupled between the other end of corresponding ones of the NAND strings and a ground potential $V_S$. For example, the drain of the transistor SGS1 is connected to the source of the array floating gate transistor 12 associated with the last word line WLn in the NAND string N1 and the source of the transistor SGS1 is connected to a second supply voltage or potential $V_S$. Similarly, the drain of the transistor SGS2 is connected to the source of the array floating gate transistor 12 associated with the last word line WLn in the NAND string N2 and the source of the transistor SGS2 is connected to the second supply potential $V_S$. Finally, the drain of the transistor SGSn is connected to the source of the array floating gate transistor 12 associated with the last word line in the NAND string Nn and the source of the transistor SGSn is connected to the second supply voltage $V_S$.

The gates of the floating gate transistors SGS1 . . . SGSn are connected together and to a common line 20. It will also be noted that the word lines WL1 . . . WLn are connected to receive a respective word line voltage $V_{WL1}$ . . . $V_{WLn}$. Further, the gates of the select gate drain transistors SGD1 . . . SGDn on the line 19 are connected to receive a select gate drain voltage $V_{SG,D}$. The gates of the select gate source transistors SGS1 . . . SGSn on the line 20 are connected to receive a select gate source voltage $V_{SG,S}$.

During a normal Read operation, a high drain voltage $V_D$ is applied (e.g., for the NAND string N1) to the drain of the select gate drain transistor SGD1. Typically, the voltage $V_D$ will be approximately +3.5 volts for a 3 V Flash EEPROM array, and the voltage $V_S$ will be typically at zero volts. In order to pass this drain voltage $V_D$, the select gate drain voltage $V_{SG,D}$ applied to the gate of the select gate drain transistor SGD1 is on the order of +4.5 V to +5.0 V. A problem arises when the drain voltage $V_D$ rises quickly so as to cause the drain-source voltage $V_{ds}$ across the select gate drain transistor to be greater than 1 volt. This will, in turn, create a high field to produce an accumulative soft unwanted programming of the select gate drain transistor SGD1.

Before describing in detail the new and improved biasing scheme for eliminating hot-carrier disturb of the select gate device according to the present invention, it is believed that it would be helpful in understanding the principles of the instant invention and to serve as a background by first explaining the investigations performed and the results of the experimentation observed by the inventor.

At the outset, the inventors conducted an investigation to explain the dependence of the source pull-up voltage $V_{S1}$ of the select gate drain transistor SGD on the voltage applied to the drain during a Read operation. To demonstrate this dependence, the source pull-up voltage $V_{S1}$ is plotted in FIG. 3 as the voltage applied to the drain is swept positively with a fixed control gate voltage $V_G$=+5.0 V as defined by the inset. It will be noted that a constant current of 30 μA was connected in series between the source and the ground potential in order to simulate a typical NAND read current. In the area A (linear region) of low drain voltage, it can be observed that the source voltage $V_{S1}$ follows linearly the drain voltage $V_D$ so as to maintain the drain-source voltage $V_{ds}$ to be less than 0.3 volts. Thus, the problem of hot-carrier disturb will not be an issue. However, as the drain voltage $V_D$ continues to increase in the area B (saturation region), the select gate drain SGD will be in saturation causing hot-carrier programming. This operation suggests that no hot-carrier read disturb will occur if the select gate device is maintained in the linear region so as to minimize the drain-source voltage $V_{ds}$ across its channel.

It is also worth noting that for the drain voltage $V_D$=+3.5 V, the source voltage will be $V_{S1}$=+2.16 V so that the drain-source voltage $V_{ds}$ will be approximately 1.3 volts. Therefore, it should be pointed out that these measurements were taken utilizing a floating gate device having a high channel doping and thus a high body factor. Consequently, if a floating gate device were doped optimally for a NAND memory architecture the drain-source voltage $V_{ds}$ would be less than 1 volt. Accordingly, by controlling the voltage pulse applied to the gate of the select gate drain device to overlap the read pulse applied to its drain, there would be no hot-carrier read disturb.

Figure 4:
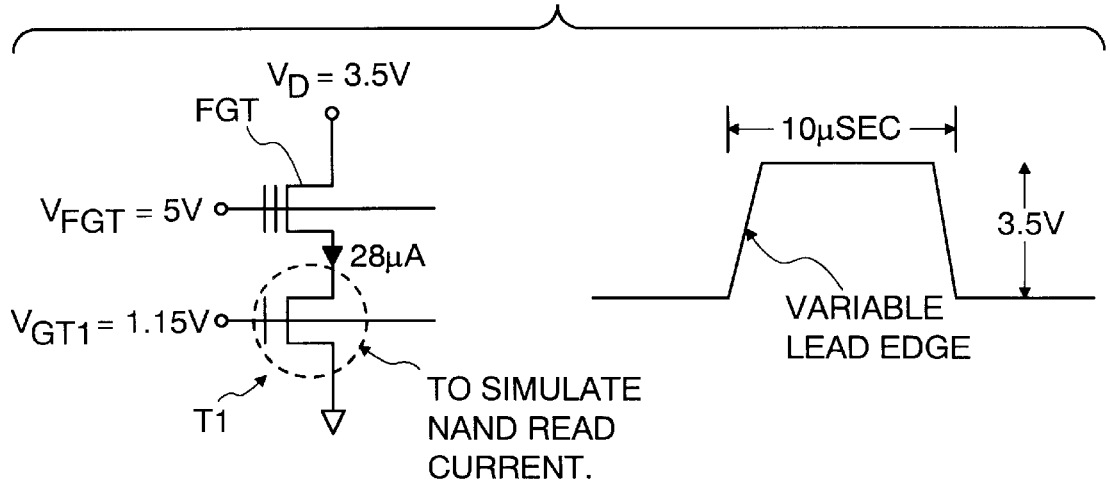
FIG. 4 is a test set-up for the method of eliminating hot-carrier disturb, according to the present invention.

In order to further demonstrate the source voltage $V_{S1}$ dependence on the leading edge of the read pulse applied to the drain, an experimental or test set-up was constructed as shown in FIG. 4 of the drawings. As can be seen, a single gate transistor T1 is connected in series with the floating gate transistor FGT used as a select gate drain device in order to simulate the NAND read operation. As illustrated, a gate voltage of $V_{GT1}$=1.15 volts was applied to the gate of the single gate transistor T1 to set up a current of approximately 28 μA which resembles closely a typical read current. A fixed control gate voltage $V_{FGT}$=+5.0 V was applied to the control gate of the select gate drain device FGT. A read pulse, as shown on the right side of FIG. 4, having a pulse width of 10 μS and a maximum amplitude of +3.5 volts is applied to the drain of the select gate drain transistor FGT. However, the value of the leading edge of the read pulse was varied.

Figure 5:
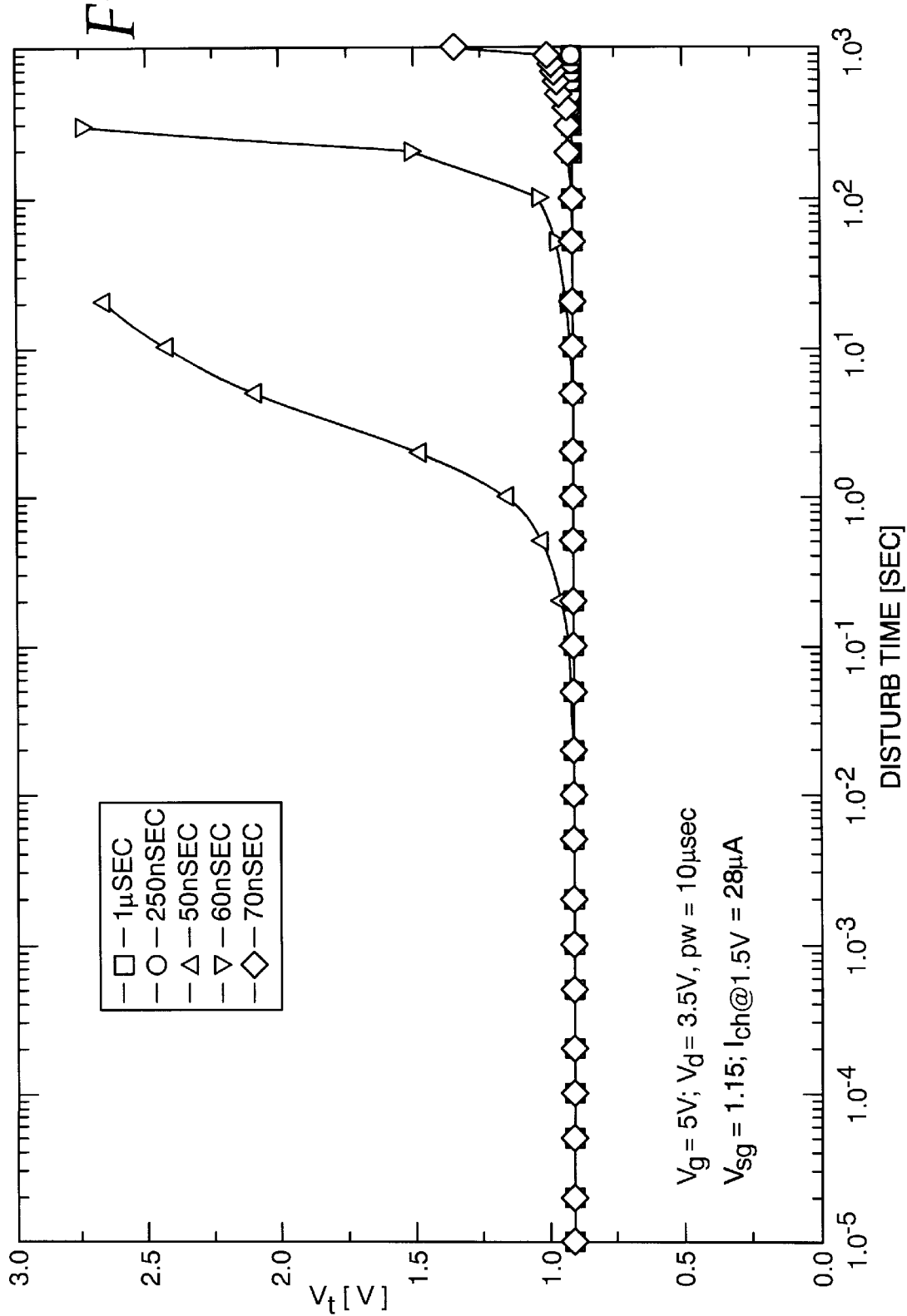
FIG. 5 shows the read disturbance of the threshold voltage $V_T$ of the select gate in FIG. 4 as a function of the ramp-rate characteristic of the leading edge of the Read pulse applied to the drain.

In FIG. 5, there is plotted the read disturb as measured by the threshold voltage $V_t$ shift, as a function of time for five different leading edge values with the applied bias conditions as defined in the inset. It can be observed that there was no threshold voltage $V_t$ shift when the value of the leading edge was longer than 250 nS and up to 1,000 nS. As the value of the leading edge is decreased, it will be noted that the threshold voltage $V_t$ shift occurs faster, indicative of hot-carrier programming.

This data demonstrates that by controlling the ramp-rate characteristic of the leading edge of the read pulse the read disturbance to 10 years can be significantly improved. In other words, by ramping up gradually the voltage applied to the drain, the source will be able to be pulled up to a high voltage before the drain reaches its maximum voltage in order to maintain a low drain-source voltage $V_{ds}$ during its operation. Based upon this experimentation, the value of the leading edge car be made as small as 100 nS. However, the exact value or the leading edge may vary dependent upon the technology (junction and gate overlap capacitance) and the bias conditions on the device. Therefore, in order to be on the safe side, it is believed that the leading edge should be on the order of 1 μS since the read pulse is typically on the order of 5–10 μS. Since the hot-carrier effect is known of be dependent on the drain and channel doping profiles, a more gradual junction and low doping will serve to further reduce the hot-carrier problem.

The read operation of the NAND memory architecture 10 of FIG. 1 will now be explained with attention directed to FIGS. 2(a) and 2(b). The biasing scheme for eliminating hot-carrier disturb of the floating gate transistor used as a select gate drain in accordance with the principles of the present invention is accomplished by controlling the gate voltage on the select gate device to overlap the read pulse applied to the drain and controlling simultaneously the leading edge of the read pulse so as to ramp up gradually. As a result, the improved biasing scheme of the present invention will maintain a drain-source voltage below 1.0 volts, thereby eliminating an accumulative soft unwanted programming of the select gate drain device.

Referring now in particular to FIG. 2(a), there is illustrated the waveform of the gate pulse voltages $V_{SG,D}$ $V_{SG,S}$ and $V_{WL1}$ ... $V_{WLn}$ applied to the respective control gates of the select gate drain transistors SGD1 ... SGDn, the select gate source transistors SGS1 ... SGSn, and the unselected array floating gate transistors 12 in the NAND memory architecture 10 during the Read operation utilizing the biasing scheme of the present invention. It should be noted that zero volts is applied to the control gates of the selected array floating gate transistors 12 which are to be read. In FIG. 2(b), there is depicted the waveform of the read pulse voltage $V_D$ applied to the drain of the select gate drain transistors SGD1 ... SGDn during this Read operation.

As can be seen, when the pulse voltage of +3.5 volts to +5.0 volts is applied to the line 19 (gate) of the select gate drain devices SGD1 ... SGDn and to the word lines WL1 ... WLn (control gates) of the array floating gate transistors 12 at time to in FIG. 2(b), there is an overlap time α between the time t0 and time t1 where the read pulse begins to ramp. The ramp-rate characteristic of the leading edge 22 is such that it ramps up gradually from 0 volts to +2.5 volts–3.5 volts over a time interval θ. This time interval θ is between the time t1 and time t2 (final maximum drain voltage). This time interval is selected so that the ramp-rate characteristic is sufficiently slow to permit the source voltage on the select gate drain device to follow the drain voltage and is preferably 100 nS or larger.

In an alternate embodiment, the select gate drain devices and the select gate source devices formed by the floating gate transistors illustrated in FIG. 1 are replaced with single gate transistors. It should be understood by those skilled in the art that the method of eliminating hot-carrier disturb of the present invention described above is equally applicable to this alternate embodiment. Thus, the details of the biasing scheme of the present invention will not be repeated.

From the foregoing detailed description, it can thus be seen that the present invention provides an improved method for eliminating hot-carrier disturb of a floating gate device used as a select gate during a read operation for NAND memory architecture. The biasing scheme of the present invention minimizes the drain-source voltage across the channel of the select gate device so as to maintain its operation in the linear region, thereby eliminating hot-carrier read disturb. This is achieved by applying a first positive pulse voltage having a ramp-rate characteristic on its leading edge to the drain of the select gate device during the read operation and simultaneously applying a second positive pulse voltage to the control gate of the select gate device so as to overlap the first positive pulse voltage.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method for eliminating hot-carrier disturb during a read operation in a NAND memory architecture in which a floating gate device is used as a select gate, said method comprising the steps of:

applying a first positive pulse voltage having a ramp-rate characteristic on its leading edge to the drain of the floating gate device during the read operation; and simultaneously applying a second positive pulse voltage to the control gate of the floating gate device during the read operation so as to overlap the first positive pulse voltage.

2. A method as claimed in claim 1, wherein said second positive pulse voltage has a magnitude higher than the magnitude of said first positive pulse voltage.

3. A method as claimed in claim 2, wherein said first positive pulse voltage has a magnitude between +2.5 volts to +3.5 volts.

4. A method as claimed in claim 3, wherein said second positive pulse voltage has a magnitude between +3.3 volts to +5.0 volts.

5. A method as claimed in claim 4, wherein said first positive pulse voltage has a width in the range of 5–10 $\mu$S.

6. A method as claimed in claim 5, wherein said first positive pulse voltage has a width of 10 $\mu$S.

7. A method as claimed in claim 6, wherein the ramp-rate characteristic on the leading edge of said first positive pulse voltage has an initial magnitude of 0 volts and gradually increases to the magnitude of +3.5 volts in a time period of greater than 100 nS.

8. A method as claimed in claim 7, wherein the time period is 1 $\mu$S.

9. A method as claimed in claim 1, wherein said ramp-rate characteristic is sufficiently slow so as to permit the source voltage on the floating gate device to follow the drain voltage.

10. A method for eliminating hot-carrier disturb during a read operation in a NAND memory architecture in which a floating gate device is used as a select gate, said method comprising the steps of:

applying a first positive pulse voltage having a ramp-rate characteristic on its leading edge to the drain of the floating gate device during the read operation;

simultaneously applying a second positive pulse voltage to the control gate of the floating gate device during the read operation so as to overlap the first positive pulse voltage; and applying said first positive pulse voltage with an initial magnitude of 0 volts and gradually increasing the magnitude to +3.5 volts in a time period of 1 $\mu$S or larger.

11. A method as claimed in claim 10, wherein said second positive pulse voltage has a magnitude higher than the magnitude of said first positive pulse voltage.

12. A method as claimed in claim 11, wherein said second positive pulse voltage has a magnitude of +5.0 volts.

13. A method as claimed in claim 12, wherein said first positive pulse voltage has a width in the range of 5–10 $\mu$S.

14. A method as claimed in claim 13, wherein said first positive pulse voltage has a width of 10 $\mu$S.

15. A method for eliminating hot-carrier disturb during a read operation in a NAND memory architecture in which a single gate device is used as a select gate, said method comprising the steps of:

applying a first positive pulse voltage having a ramp-rate characteristic on its leading edge to the drain of the single gate device during the read operation; and simultaneously applying a second positive pulse voltage to the control gate of the single gate device during the read operation so as to overlap the first positive pulse voltage.

16. A method as claimed in claim 15, wherein said second positive pulse voltage has a magnitude higher than the magnitude of said first positive pulse voltage.

17. A method as claimed in claim 16, wherein said first positive pulse voltage has a magnitude between +2.5 volts to +3.5 volts.

18. A method as claimed in claim 17, wherein said second positive pulse voltage has a magnitude between +3.3 volts to +5.0 volts.

19. A method as claimed in claim 18, wherein said first positive pulse voltage has a width in the range of 5–10 $\mu$S.

20. A method as claimed in claim 19. wherein said first positive pulse voltage has a width of 10 $\mu$S.

* * * * *

UNITED STATES PATENT AND TRADEMARK OFFICE
CERTIFICATE OF CORRECTION

PATENT NO. : 5,815,438
DATED : September 29, 1998
INVENTOR(S) : Sameer S. Haddad et al.

It is certified that error appears in the above-indentified patent and that said Letters Patent is hereby corrected as shown below:

Column 5, line 56, change "CAR" to --CAN--.

Signed and Sealed this

Fifth Day of January, 1999

*Attest:*

*Attesting Officer*

*Acting Commissioner of Patents and Trademarks*